United States Patent
Buff et al.

(10) Patent No.: US 9,793,087 B2
(45) Date of Patent: Oct. 17, 2017

(54) TECHNIQUES AND APPARATUS FOR MANIPULATING AN ION BEAM

(71) Applicant: Varian Semiconductor Equipment Associates, Inc., Gloucester, MA (US)

(72) Inventors: James S. Buff, Brookline, NH (US); Victor Benveniste, Lyle, WA (US); Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 109 days.

(21) Appl. No.: 14/849,813

(22) Filed: Sep. 10, 2015

(65) Prior Publication Data
US 2017/0076908 A1   Mar. 16, 2017

(51) Int. Cl.
*H01J 37/147* (2006.01)
*H01J 37/14* (2006.01)
*H01J 37/317* (2006.01)

(52) U.S. Cl.
CPC .......... *H01J 37/1475* (2013.01); *H01J 37/14* (2013.01); *H01J 37/3171* (2013.01); *H01J 2237/1415* (2013.01); *H01J 2237/31701* (2013.01)

(58) Field of Classification Search
CPC combination set(s) only.
See application file for complete search history.

(56) References Cited

U.S. PATENT DOCUMENTS

| | | | |
|---|---|---|---|
| 5,736,743 A | 4/1998 | Benveniste | |
| 2007/0023697 A1* | 2/2007 | Purser | H01J 37/14 250/492.21 |
| 2010/0001204 A1* | 1/2010 | White | H01J 37/147 250/398 |
| 2010/0237232 A1 | 9/2010 | Chen | |
| 2013/0256552 A1 | 10/2013 | Glavish et al. | |

FOREIGN PATENT DOCUMENTS

WO   02063654 A2   8/2002

OTHER PUBLICATIONS

ISR and Written Opinion mailed Nov. 23, 2016 (Nov. 23, 2016), in corresponding international patent application No. PCT/US2016/048614.

* cited by examiner

*Primary Examiner* — Phillip A Johnston
*Assistant Examiner* — Hsien Tsai

(57) ABSTRACT

A method may include: generating an ion beam from an ion source, the ion beam having an initial direction of propagation; deflecting the ion beam at an initial angle of inclination with respect to the initial direction of propagation; passing the ion beam through an aperture in a magnetic assembly; and generating in the aperture, a quadrupole field extending along a first direction perpendicular to the initial direction of propagation of the ion beam, and a dipole field extending along a second direction perpendicular to the first direction and the initial direction of propagation.

19 Claims, 7 Drawing Sheets

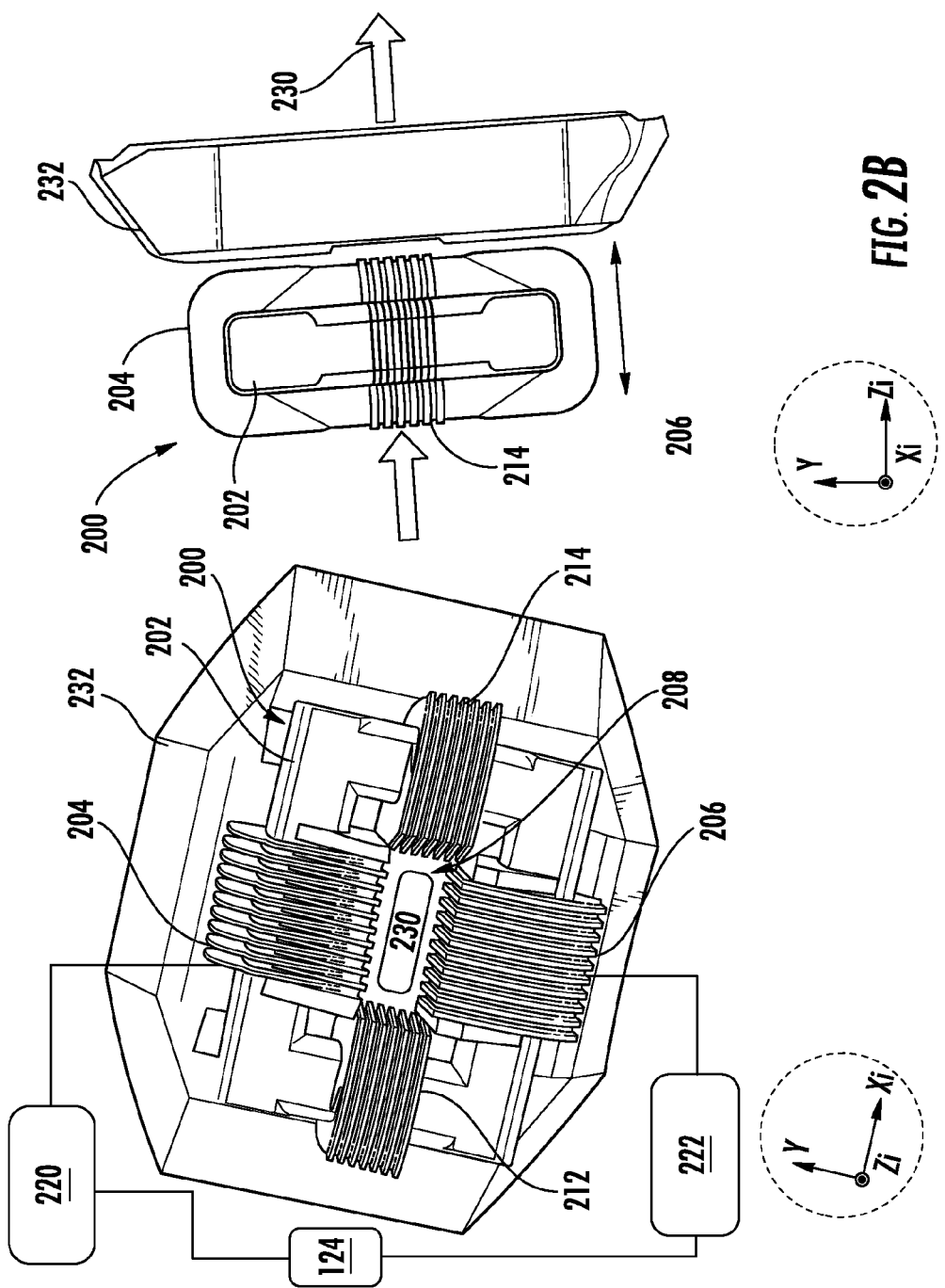

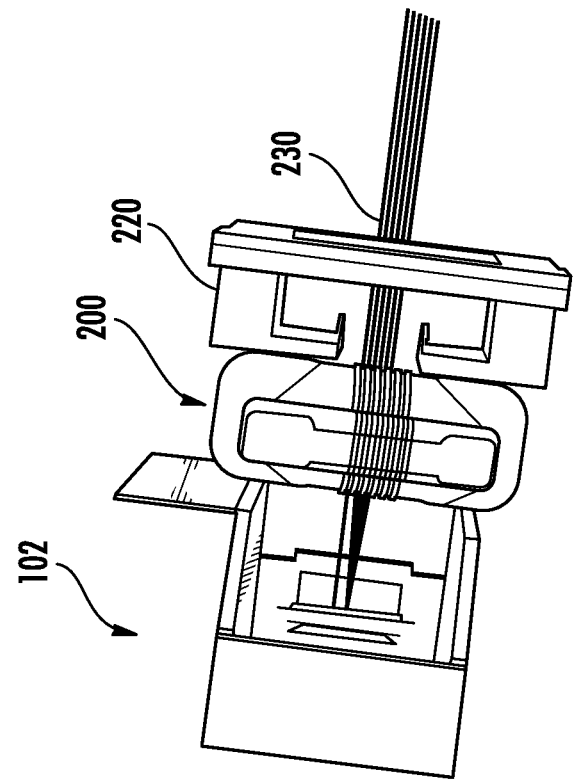
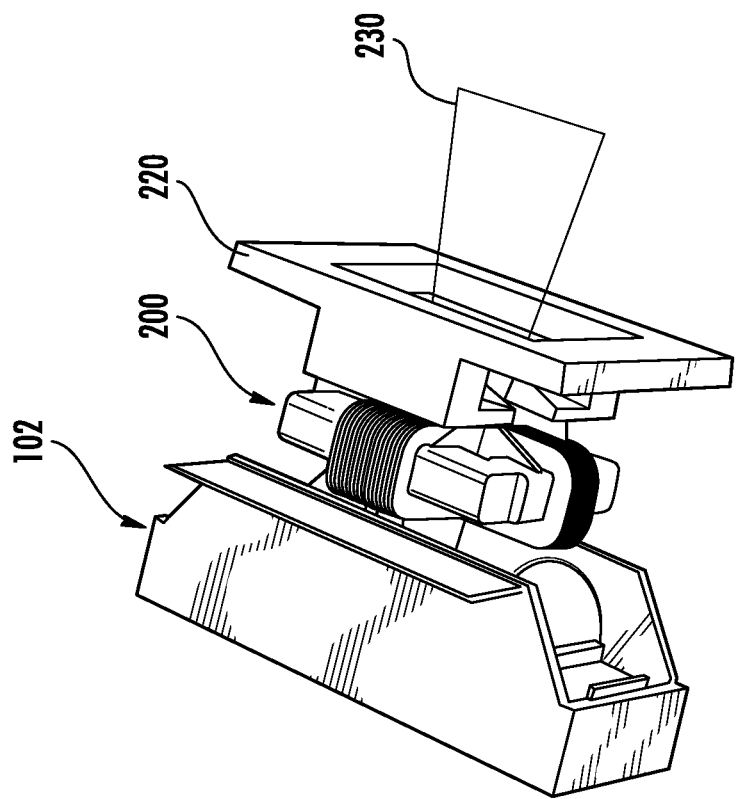
FIG. 3B
FIG. 3A

TECHNIQUES AND APPARATUS FOR MANIPULATING AN ION BEAM

FIELD

Embodiments relate to the field of ion generation.

BACKGROUND

In the present day, beamline ion implanters employ multiple components to direct a spot beam or ribbon beam from an ion source to a substrate. In order to properly treat a substrate, the ion beam may be accelerated to a target ion energy, and may be manipulated to achieve a target beam dimension. Additionally, the ion beam may be deflected to achieve a desired orientation as the ion beam travels through the beamline toward the substrate. Moreover, the ion beam may be adjusted to achieve a target degree of convergence, divergence, or parallelism. In addition, the ion beam may be manipulated to adjust the position of the ion beam during propagation of the ion beam toward the substrate. Various components may be employed to achieve these results, often entailing a balance between one characteristic of the ion beam, such as position, with respect to other characteristics of the ion beam, such as divergence.

In one particular example, beamline ion implanters employing magnetic ion sources may adjust the ion beam as the ion beam enters a magnetic analyzer used to mass analyze the ion beam. Heretofore, the angle of the ion beam may be adjusted toward a target angle at the expense of displacing the ion beam from a target position. For example, in a magnetic ion source, the ion beam is inherently bent downwardly (or upwardly) by fields generated by an ion source magnet as the ion beam is launched from the ion source. This bending may be partially compensated for by launching the ion beam at an upward angle so that the ion beam assumes a target angle of inclination, such as parallel to a given plane, as the ion beam enters a magnetic analyzer. In this circumstance, the ion beam may be displaced to a position lying high with respect to a target position for entering the magnetic analyzer. Conventional ion implantation schemes may accordingly balance the angle of inclination of the ion beam and the position of the ion beam to achieve an acceptable compromise in these two parameters.

It is with respect to these and other considerations the present improvements are provided.

BRIEF SUMMARY

This Summary is provided to introduce a selection of concepts in a simplified form where the concepts may be further described below in the Detailed Description. This Summary is not intended to identify key features or essential features of the claimed subject matter, nor is the summary intended as an aid in determining the scope of the claimed subject matter.

In one embodiment, a method may include generating an ion beam from an ion source, the ion beam having an initial direction of propagation; deflecting the ion beam at an initial angle of inclination with respect to the initial direction of propagation; passing the ion beam through an aperture in a magnetic assembly; and generating in the aperture, a quadrupole field extending along a first direction perpendicular to the initial direction of propagation of the ion beam, and a dipole field extending along a second direction perpendicular to the first direction and the initial direction of propagation.

In another embodiment, an apparatus to manipulate an ion beam may include: a deflector to receive an ion beam having an initial direction of propagation and to deflect the ion beam along an initial angle of inclination with respect to the initial direction of propagation; and a magnetic assembly disposed downstream to the deflector. The magnetic assembly may define an aperture to receive the ion beam and further comprise: a magnetic yoke and a coil assembly, the coil assembly comprising a first coil disposed along a first side of the magnetic yoke, and a second coil disposed along a second side of the magnetic yoke opposite the first side. The apparatus may further include a first current supply coupled to the first coil and a second current supply coupled to the second coil; and an ion beam controller electrically coupled to the deflector and to the first current supply and the second current supply, the ion beam controller directing a first control signal to the first current supply and second control signal to the second current supply, wherein the first coil and second coil simultaneously generate a magnetic dipole field and a magnetic quadrupole field within the aperture.

In another embodiment, an ion implanter may include an ion source having an elongated aperture to generate a ribbon beam having an elongated cross-section and further having an initial direction of propagation; a deflector to receive the ribbon beam and to deflect the ribbon beam along an initial angle of inclination with respect to the initial direction of propagation; and a magnetic assembly disposed downstream to the deflector. The magnetic assembly may define an aperture to receive the ribbon beam and may further comprise: a magnetic yoke and a coil assembly, the coil assembly comprising a first coil disposed along a first side of the magnetic yoke, and a second coil disposed along a second side of the magnetic yoke opposite the first side. The apparatus may further include a first current supply coupled to the first coil and a second current supply coupled to the second coil. The apparatus may further include an ion beam controller electrically coupled to the deflector and to the first current supply and the second current supply, the ion beam controller directing a first control signal to the first current supply and second control signal to the second current supply, wherein the first coil and second coil simultaneously generate a magnetic dipole field and a magnetic quadrupole field within the aperture.

BRIEF DESCRIPTION OF THE DRAWINGS

FIG. 2A depicts details of a magnetic assembly in an end view, according to various embodiments of the disclosure;

FIG. 2B presents a side view of the magnetic assembly of FIG. 2A;

FIG. 3A and FIG. 3B show details of the geometry of an apparatus for manipulating an ion beam according to embodiments of the disclosure;

DETAILED DESCRIPTION

Figure 1:
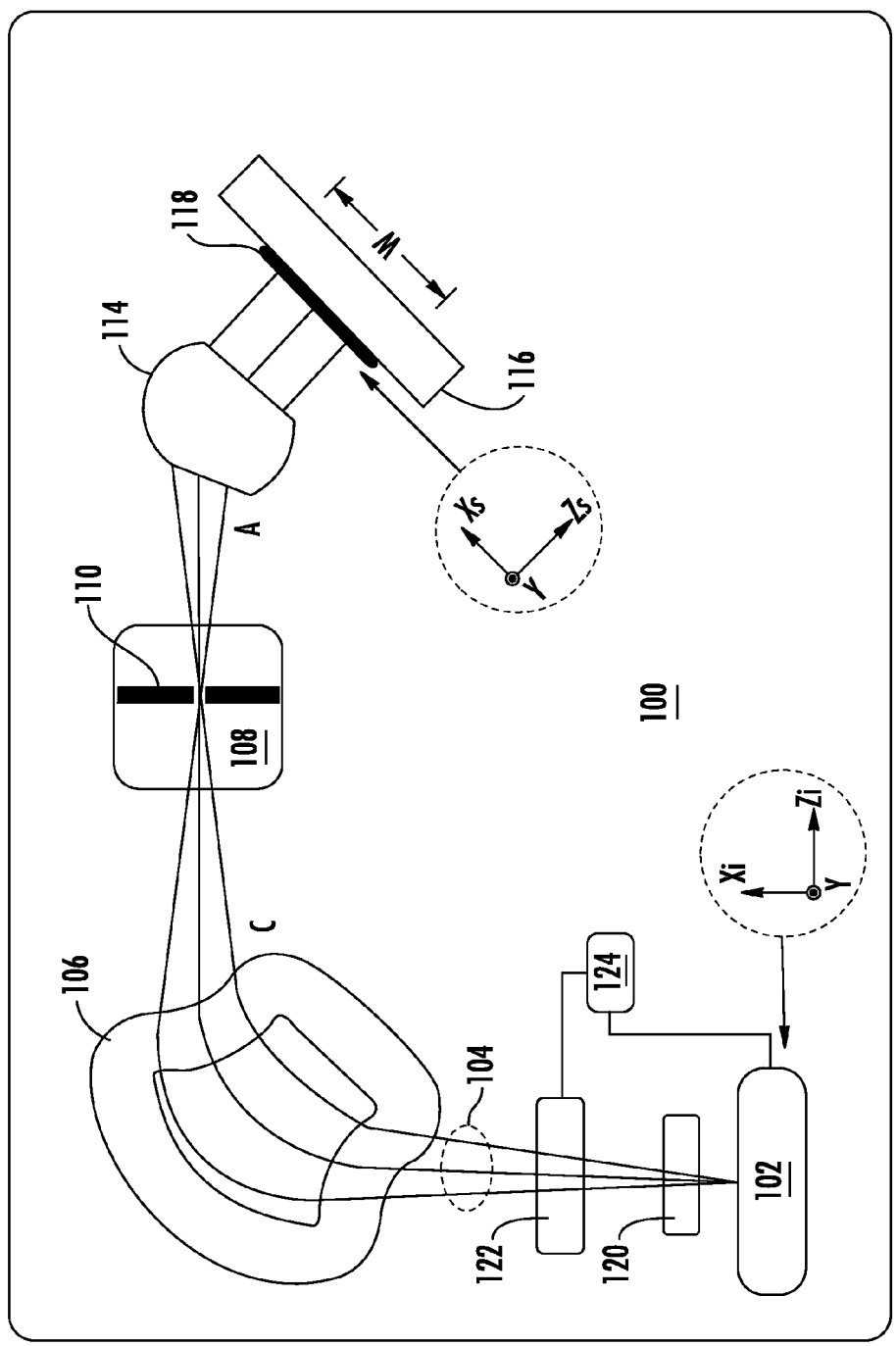
FIG. 1 depicts an ion implanter arranged according to embodiments of the disclosure.

The present embodiments will now be described more fully hereinafter with reference to the accompanying drawings, where some embodiments are shown. The subject matter of the present disclosure may be embodied in many different forms and is not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel techniques and apparatus to control an ion beam in an ion implanter. In various embodiments an apparatus may be used to control angle of inclination as well as position of an ion beam so as to improve such ion beam parameters. In various embodiments, the techniques and apparatus disclosed herein may be employed to control ion beams having a relatively low mass-energy product such as 500 amu-keV. In other embodiments, control of ion beams having a mass-energy greater than 500 amu-keV may be advantageously controlled.

FIG. 1 depicts an ion implanter 100 arranged according to embodiments of the disclosure. The ion implanter 100 may be used to generate and direct an ion beam 104, such as a spot beam or ribbon beam, to a substrate stage 118, as shown. The ion implanter 100 may include an ion source 102, magnetic analyzer 106, chamber 108 including a mass analysis slit 110, collimator 114, and substrate stage 118. The ion implanter 100 may include other components as known in the art to further manipulate the ion beam 104 between the ion source 102 and substrate stage 118. In the Cartesian coordinate systems shown in FIG. 1, the Y-axis may represent a fixed direction, while the direction of the Z-axis may represent the direction of propagation of an ion beam at a given point in the beamline. Hence, the absolute direction of the Z-axis may differ at different points in the beamline, as represented by the different subscripts shown. The X-axis may lie perpendicular to the Z-axis and Y-axis, and therefore the absolute direction of the X-axis may change along the beamline also. Regarding the embodiments disclosed herein, in the portions of the beamline before the magnetic analyzer 106, the X-axis, Y-axis and Z-axis may remain fixed.

In various embodiments, the ion source 102 may be a magnetic ion source having a magnet (not separately shown) disposed around or adjacent the ion source chamber of the ion source 102. When the ion beam 104 exits the ion source 102, the ion beam 104 may experience a magnetic field generated by the magnet tending to bend the ion beam 104. In particular embodiments where the ion source 102 generates a ribbon beam, the magnetic field may be generated to lie parallel to the X-axis. This orientation of the magnetic field may result in bending the ion beam 104 either upwardly or downwardly with respect to the X-Z plane as the ion beam 104 traverses the ion source magnetic field.

In accordance with the present embodiments, various techniques and components are provided to adjust the ion beam 104 before the ion beam 104 enters the magnetic analyzer 106. As an example, the ion implanter 100 may include a deflector 120, where the deflector 120 may deflect the ion beam 104 with respect to an initial direction of propagation, as discussed below. In various embodiments, the deflector 120 may be a manipulator capable of adjusting the separation between extraction electrodes and an exit aperture (neither component separately shown) of the ion source 102. By moving the extraction electrodes closer to, or further away from, the exit aperture of ion source 102, the initial angle of inclination of the ion beam 104 may be adjusted. In various embodiments, this initial angle of inclination may vary between 1 degree and 4 degrees. The embodiments are not limited in this context.

The ion implanter 100 may also include a magnetic assembly 122 disposed downstream to the deflector 120. As shown in FIG. 1, the magnetic assembly 122 may be disposed between the deflector 120 and the magnetic analyzer 106. The ion implanter 100 may further include an ion beam controller 124 electrically coupled directly or indirectly, to the magnetic assembly 122 and deflector 120. The ion beam controller 124 may generate control signals for controlling magnetic fields generated by the magnetic assembly 122, leading to improved characteristics of the ion beam 104 as the ion beam 104 enters the magnetic analyzer 106.

FIG. 2A and FIG. 2B present an end view and side view, respectively, of a magnetic assembly 200 according to various embodiments. The magnetic assembly 200 may be a variant of the magnetic assembly 122 and may be disposed, as shown generally in FIG. 1. The magnetic assembly 200 may include a magnetic yoke 202, and a coil assembly, where the coil assembly includes a first coil, shown as the upper coil 204, disposed along a first side of the magnetic yoke 202. The coil assembly may also include a second coil, shown as the lower coil 206, disposed along a second side of the magnetic yoke 202, opposite the first side. As detailed below, the upper coil 204 and lower coil 206 may generate a quadrupole magnetic field extending along a first direction, in particular, along the Y-axis.

The upper coil 204 may have a first coil axis extending along a second direction perpendicular to the first direction, in particular, extending along the X-axis, while the lower coil 206 has a second coil axis also extending along the X-axis.

As further shown in FIG. 2A, a first current supply 220 may be coupled to the upper coil 204, while a second current supply 222 is coupled to the lower coil 206. The first current supply 220 and second current supply 222 may operate independently from one another to supply a first current to the upper coil 204 and second current to the lower coil 206, respectively. For example, the ion beam controller 124 may be coupled to the first current supply 220 and to the second current supply 222, wherein the ion beam controller 124 directs control signals to the upper coil 204 and lower coil 206 to independently supply current to the upper coil 204 and lower coil 206. Thus, in one mode of operation, the ion beam controller 124 may generate a first control signal and second control signal, wherein first current supply 220 includes a first component to generate a first current at a first magnitude in the upper coil 204 responsive to the first control signal. The second current supply 222 may include a second component to generate a second current at a second magnitude in the lower coil 206 responsive to the second control signal, where the second magnitude is different from the first magnitude.

As further illustrated in FIG. 2A, the magnetic assembly 200 may define an aperture 208 to receive an ion beam 230 and pass the ion beam 230 toward the front portion 232 of a magnetic analyzer, such as the magnetic analyzer 106. The aperture 208 may be designed to accommodate an ion beam of a target shape and size, such as a ribbon beam, as generally illustrated in FIG. 2A. A ribbon beam may be characterized by an elongated cross-section. In the example of FIG. 2A, the width (long axis) of the ion beam 230 along the Xi-axis of the Cartesian coordinate system shown may be greater than the height (short axis) of the ion beam 230 along the Y-axis. The aperture 208 may be designed to accommodate such an elongated (in cross-section) ion beam as shown. In some examples, the width of the aperture 208 may exceed 50 mm, or may exceed 100 mm in order to accommodate a ribbon beam. The embodiments are not limited in this context. The aperture 208 may also extend along the Zi-axis for some distance, for example, for 50 mm to 250 mm. The embodiments are not limited in this context.

In accordance with various embodiments, the ion beam 230 may be manipulated while passing through the aperture 208. As illustrated, the upper coil 204 is disposed on a first side of the aperture 208 while the lower coil 206 is disposed on a second side of the aperture 208 opposite the first side. The upper coil 204 and lower coil 206 may generate magnetic fields in different manners. For example, the magnetic assembly 200 may generate magnetic field(s) within the aperture 208, where the magnetic fields steer and shape the ion beam 230 during passage through the aperture 208. In some embodiments, the magnetic assembly 200 may be controlled to generate a quadrupole magnetic field while simultaneously generating a dipole magnetic field within the aperture 208. These two fields may act in conjunction to steer and move the ion beam 230 in an advantageous manner as generally described below.

The magnetic assembly 200 may also include a first bucking coil 212 disposed on a third side of the aperture 208, and a second bucking coil 214 disposed on a fourth side of the aperture 208. The first bucking coil 212 and second bucking coil 214 may have a known design and known function. As shown, the first bucking coil 212 and second bucking coil 214 may have a first bucking coil axis and second bucking coil axis, respectively, where these axes extend along a direction parallel to the Y-axis. A bucking current may be provided within the first bucking coil 212 and second bucking coil 214.

Turning now to FIG. 3A and FIG. 3B, there are shown further details of the geometry of an apparatus for manipulating the ion beam 230. In particular embodiments, in conjunction with manipulating the ion beam 230 using the magnetic assembly 200, the ion beam 230 may be deflected along a target trajectory as the ion beam 230 emerges from the ion source 102. In one example, the ion beam 230 may emerge from the ion source 102 as a ribbon beam having ions whose trajectories are parallel to one another as viewed in the Xi-Z plane (parallel in X). The ions of the ion beam 230 may emerge from the ion source with an initial divergence as viewed in the Y-Zi plane, such as 5 degrees or less, and in some embodiments, +/−2.0 degrees, +/−2.5 degrees, or +/−3 degrees with respect to the Xi-Y plane. The embodiments are not limited in this context. The divergence may represent the range of angles of inclination of trajectories of different ions in the ion beam 230, where the range is measured with respect to a given reference, such as a reference plane.

The magnetic assembly 200 may manipulate the ion beam 230 in a manner rendering the ion beam divergent as viewed in the Xi-Y plane as the ion beam enters the front portion 232 of a magnetic analyzer. In one example, the trajectories may have a divergence of +/−8 degrees with respect to the Y-Zi plane. The embodiments are not limited in this context. Additionally, the magnetic assembly 200 may steer the ion beam 230 in a manner placing the ion beam 230 at a target height along the Y-axis, having a target direction, as well as a target divergence.

For example, referring again also to FIG. 1, the ion beam 230 may be steered through the magnetic assembly 200 in a manner where the ion beam 230 emerges centered about a center plane of the beamline of the ion implanter 100. The center plane may correspond to a Xi-Z plane extending through the center of the ion source 102 as well as magnetic analyzer 106. Accordingly, as the ion beam 230 enters the magnetic analyzer 106 the ion beam 230 may be positioned along the center (with respect to the Y-axis) of the magnetic analyzer. Moreover, the ion beam 230 may be oriented parallel to the Zi direction and parallel to the X-Zi plane, meaning the trajectories on average of the ions of ion beam 230 lie parallel to the Xi-Zi plane. Additionally, the ion beam 230 may have a very low divergence with respect to the Xi-Zi plane, such as less than 1.5 degrees in some embodiments.

Figure 4:
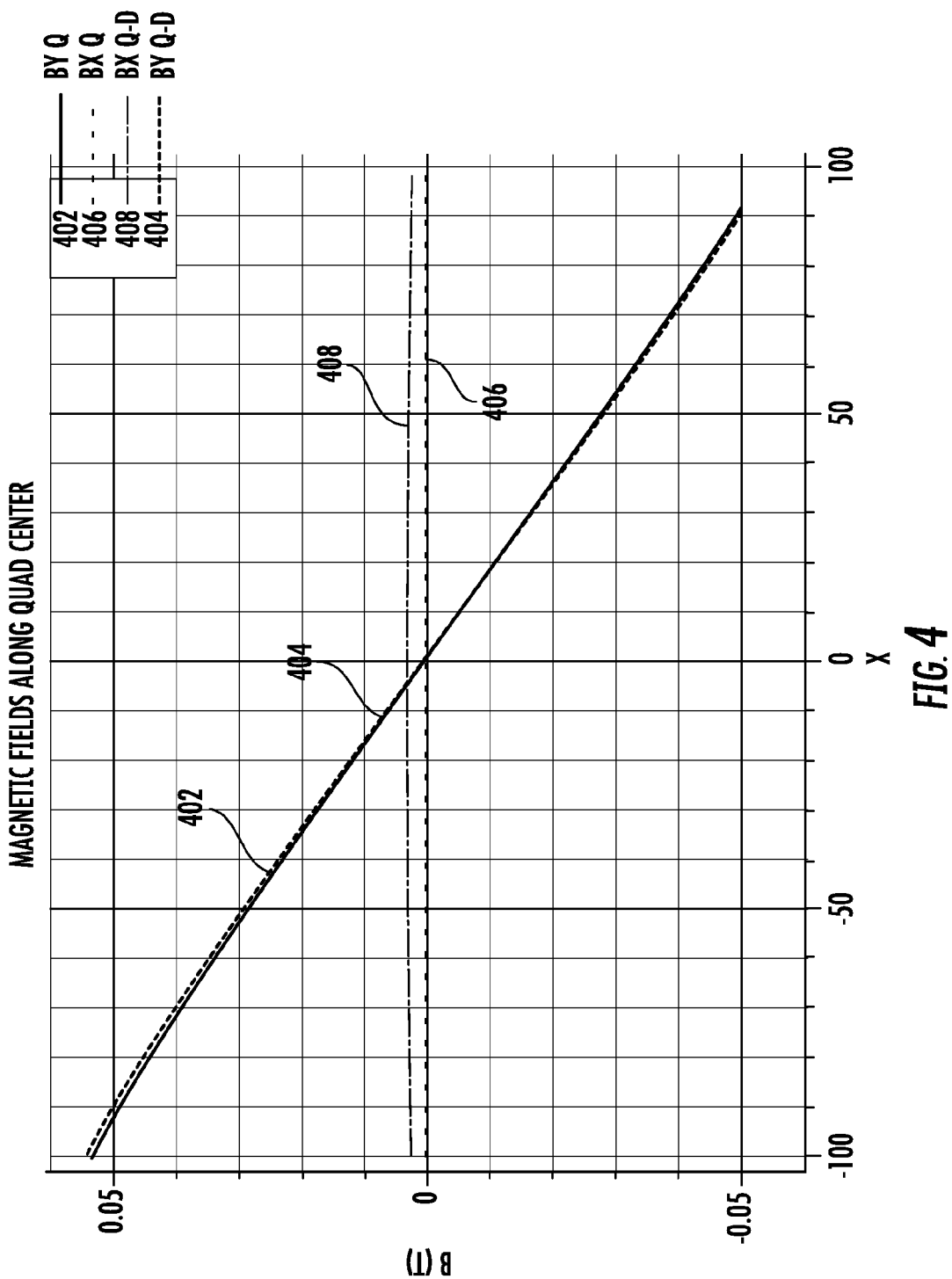
FIG. 4 shows exemplary curves for exemplary magnetic fields generated by a magnetic assembly in accordance with the present embodiments.

In accordance with various embodiments, novel techniques are provided in order to generate an ion beam where the ion beam is centered, has a low divergence, and lies parallel to a center plane of the beamline as the ion beam enters the magnetic analyzer. These techniques overcome the tradeoffs employed in conventional ion implanters where ion beam generating a parallel ion beam may occur at the expense of displacing the ion beam from a center plane. In various embodiments, a magnetic assembly, such as the magnetic assembly 122 or magnetic assembly 200, may be controlled to simultaneously generate a quadrupole field as well as a dipole field while an ion beam traverses through the magnetic assembly. Turning now to FIG. 4, there are shown exemplary magnetic fields generated by a magnetic assembly, in accordance with the present embodiments. In particular, the curve 402 represents a quadrupole field and curve 406 a corresponding dipole field, where curve 402 and curve 404 are generated by a magnetic assembly under a first set of conditions. In particular, the magnetic assembly may be deemed to be operating under a "pure quadrupole" mode to generate the curves 402 and curve 406.

The curve 404 corresponds to the magnetic field intensity in a direction parallel to the Y-axis as a function of position along the X-axis. This curve may represent the intensity of the quadrupole field generated within a magnetic assembly aperture, such as the aperture 208. As shown in FIG. 4, the quadrupole field magnitude, in other words, the intensity of the quadrupole field, varies monotonically from a relatively large positive value to a relatively large negative value between a first position corresponding to X=−100 mm to a second position corresponding to X=+100 mm. The curve 406 represents the intensity of a magnetic field lying parallel to the X-direction as a function of position along the X-axis, and may represent the intensity of a dipole field. In this example, the intensity of the magnetic field is zero across the entire range of positions shown. Referring again to FIG. 2A, in one example, the curve 402 and curve 406 may be generated simultaneously by operating the magnetic assembly 200 in a pure quadrupole mode, as detailed in the following manner. The upper coil 204 and lower coil 206 may be configured the same as one another. Moreover, the first current supply 220 may provide a first current to the upper coil 204 while the second current supply 222 provides a second current to the lower coil 206, where the first current and second current are equal to one another. In this manner, the upper coil 204 and lower coil 206 may generate a quadrupole field, as represented by curve 402. Because the currents traveling within the upper coil 204 and lower coil 206 are equal to one another, no dipole field may be created, as represented by the zero value of the curve 406.

In another example, the curve 404 and curve 408 may be generated simultaneously by operating the magnetic assembly 200 in a mixed quadrupole and dipole mode, in the following manner. The first current supply 220 may provide a first current to the upper coil 204 while the second current supply 222 provides a second current to the lower coil 206, where the first current and second current are unequal to one another; in other words, a first magnitude of the first current is different from a second magnitude of the second current. In this manner, the upper coil 204 and lower coil 206 may generate a quadrupole field, as represented by curve 404. Because the currents traveling within the upper coil 204 and lower coil 206 are different from one another, a dipole field having a non-zero value may be generated, as shown by the curve 408. Curve 408 shows the dipole field magnitude of the dipole field varies by less than 50% as a function of position along the X-axis between a first end region and second end region, respectively. In this case, the dipole field magnitude is in the range of 30 Gauss.

Thus, a difference between conditions for generating the curve 402 and curve 406, as opposed to curve 404 and curve 408, is the following: in one instance, currents through the upper coil are equal, while in another instance, a greater current is provided through an upper coil or lower coil. In one example, specifically illustrated in FIG. 4, for operating in the mixed quadrupole and dipole mode, the current through the upper coil may be 110% while the current through the lower coil may be 90%, with respect to a reference level.

Figure 5A:
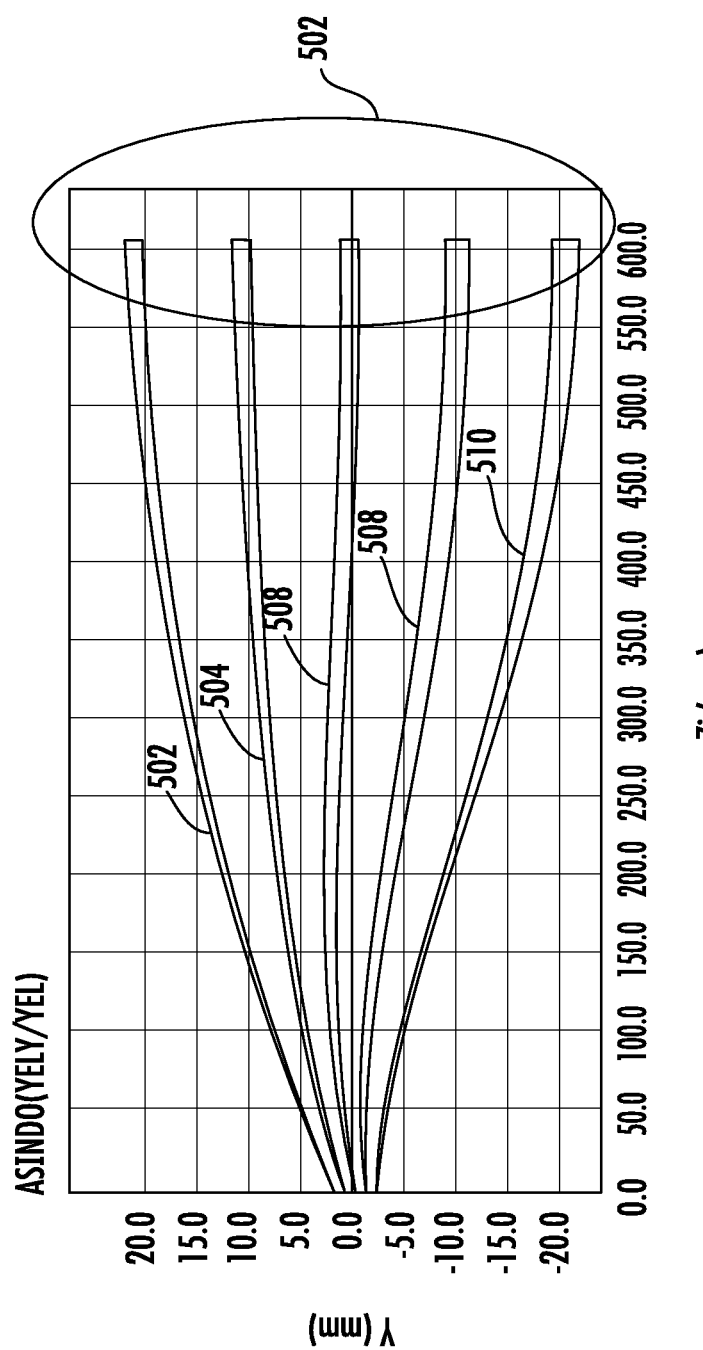
FIG. 5A and FIG. 5B present ion beam characteristics generated when an ion beam is processed by a magnetic assembly in accordance with embodiments of the disclosure.
Figure 5B:
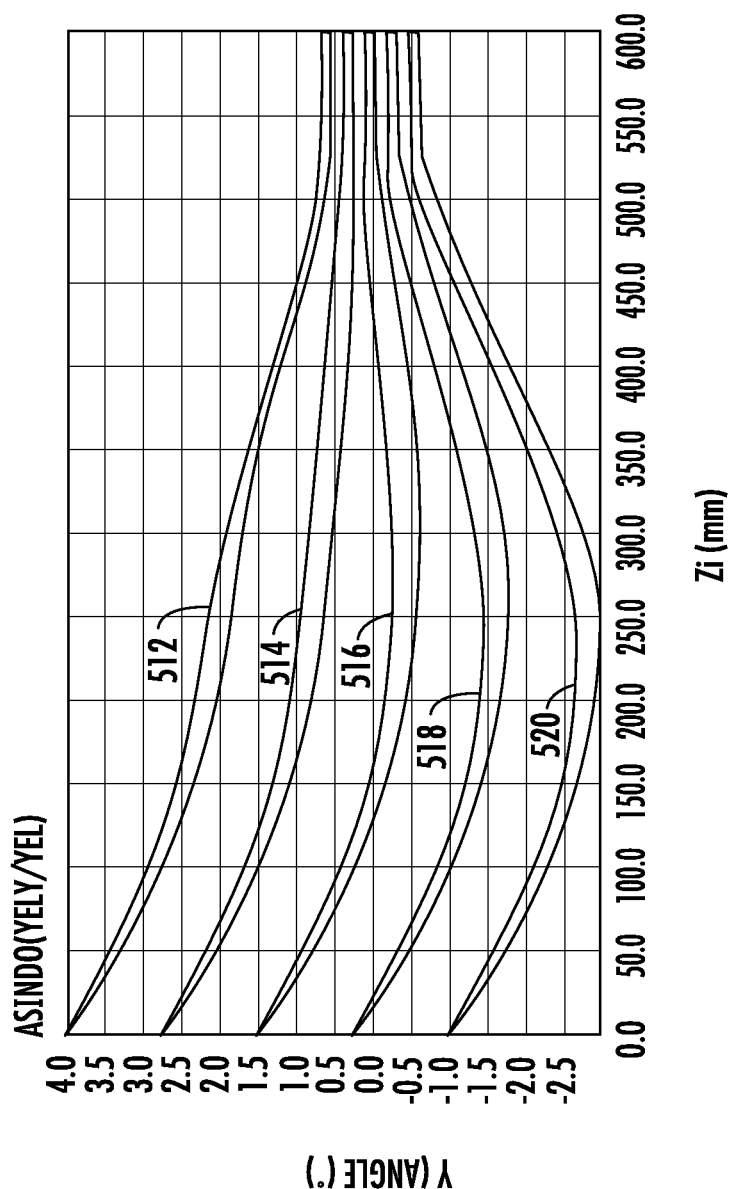

According to embodiments of the disclosure, FIG. 5A and FIG. 5B present ion beam characteristics generated when an ion beam is processed by a magnetic assembly operating in a mixed quadrupole and dipole mode, as exemplified by curve 404 and curve 408. In particular, the results of FIG. 5A and FIG. 5B are simulated results based on operating a magnetic assembly in the mixed quadrupole and dipole mode, where the current through the upper coil is 110% while the current through the lower coil is 90%.

Additionally, in the scenario of FIG. 5A and FIG. 5B, a ribbon beam is launched from an ion source having an initial angle of inclination of +1.5 degrees with respect to an Xi-Zi plane, or with respect to an initial direction of propagation of the ribbon beam, lying along the direction parallel to the Zi-axis. As noted above, this launching may be accomplished by adjusting a deflector disposed between the ion source generating the ribbon beam and the magnetic assembly. By deflecting the ion beam and by providing a dipole field of non-zero value simultaneously with a quadrupole field, an ion beam may be better manipulated to achieve a target position as well as a zero degree angle of inclination as discussed below.

Turning now to FIG. 5A in particular, there is shown a series of curves; curve 502, curve 504, curve 506, curve 508, and curve 510, where the curves represent the position of a select portion of an ion beam 500, in this case a 23 keV Boron beam, as a function of distance along the Zi-axis. The curve 502 may represent an upper part of the ion beam 500 while the curve 510 represents a lower part of the ion beam 500. The center of an ion source may be represented by the position at Zi=0 mm. As illustrated, the ion beam 500 may have an initial height of approximately 5 mm or so, emerging from the ion source, and may expand to a height of 40 mm or so at Zi=600 mm. The trajectories of different portions of the ion beam 500 may be asymmetrical with respect to an X-Z plane through Y=0, since the ion beam 500 is launched with an initial angle of inclination of +1.5 degrees. In the example of FIG. 5A, a magnetic assembly may be assumed to bound the ion beam 500 over a region spanning the distance between approximately Zi=280 mm to 480 mm. Additionally, a front edge of a magnet of a magnetic analyzer may be assumed to be positioned at approximately Zi=600 mm. Notably, after passing through the region bounded by a magnetic assembly the ion beam 500 is centered about Y=0 when Zi.

Turning now to FIG. 5B, there are shown a series of curves; curve 512, curve 514, curve 516, curve 518, and curve 520, where the curves represent the angle of inclination of ions of select portions of the ion beam 500 as a function of distance along the Zi-axis. The angle of inclination, referred to in FIG. 5B as the "Y angle," refers to the angle of ions with respect to the initial direction of propagation of an ion beam along the Zi direction, or with respect to the Xi-Zi plane as noted previously. In this example, the curve 512 may represent the angle of inclination of the portion of the ion beam 500 corresponding to curve 502, the curve 514 may correspond to curve 504, the curve 516 may correspond to curve 506, and so forth. As illustrated, the angle of inclination for the initial trajectories at Zi=0 ranges from +4.0 degrees for curve 512 to −1 degree for curve 520, with an average of +1.5 degree. Accordingly, the ion beam 500 exhibits a divergence in the Y-direction of 5 degrees at Zi=0 mm. In the simulation of FIG. 5B, the results do not depict the initial direction of propagation of the ion beam 500 lying along the Zi-axis, just the angle of inclination (1.5 degrees on average) of the ion beam 500 after deflection. As noted, this deflection may be accomplished by adjusting the distance between extraction electrodes and exit aperture of an ion source.

In the example of FIG. 5B, the magnet of the ion source may be assumed to bend the ion beam 500 downwardly with respect to the Zi-axis. Accordingly, the angle of inclination initially becomes increasingly negative for the different curves up to Zi=250 mm. Notably, after passing through the region bounded by the magnetic assembly between Zi=280 mm and 480 mm, a reduced divergence is generated, where the divergence drastically decreases to just greater than 1 degree. Additionally, the average angle of inclination is zero, meaning the ion beam 500 lies parallel to the Xi-Z plane as the ion beam 500 enters an analyzer magnet.

In accordance with various embodiments, to account for ion beams having ions of different mass or different ion energy, the different currents supplied to an upper coil and lower coil of a magnetic assembly, as well as position of a deflector may be adjusted to generate results similar to those shown in FIG. 5A and FIG. 5B. For example, an ion source electromagnet may employ different magnetic field strengths to confine a plasma in the ion source depending on the ion type in the plasma. The different magnetic field strengths in turn may bend ions emerging from an ion source along different trajectories. Accordingly, to accommodate for different ion mass, ion energy, as well as ion source magnetic field, an initial angle of inclination of an ion beam may be adjusted by adjusting a deflector, as well the quadrupole field and dipole field of a magnetic assembly.

Figure 6:
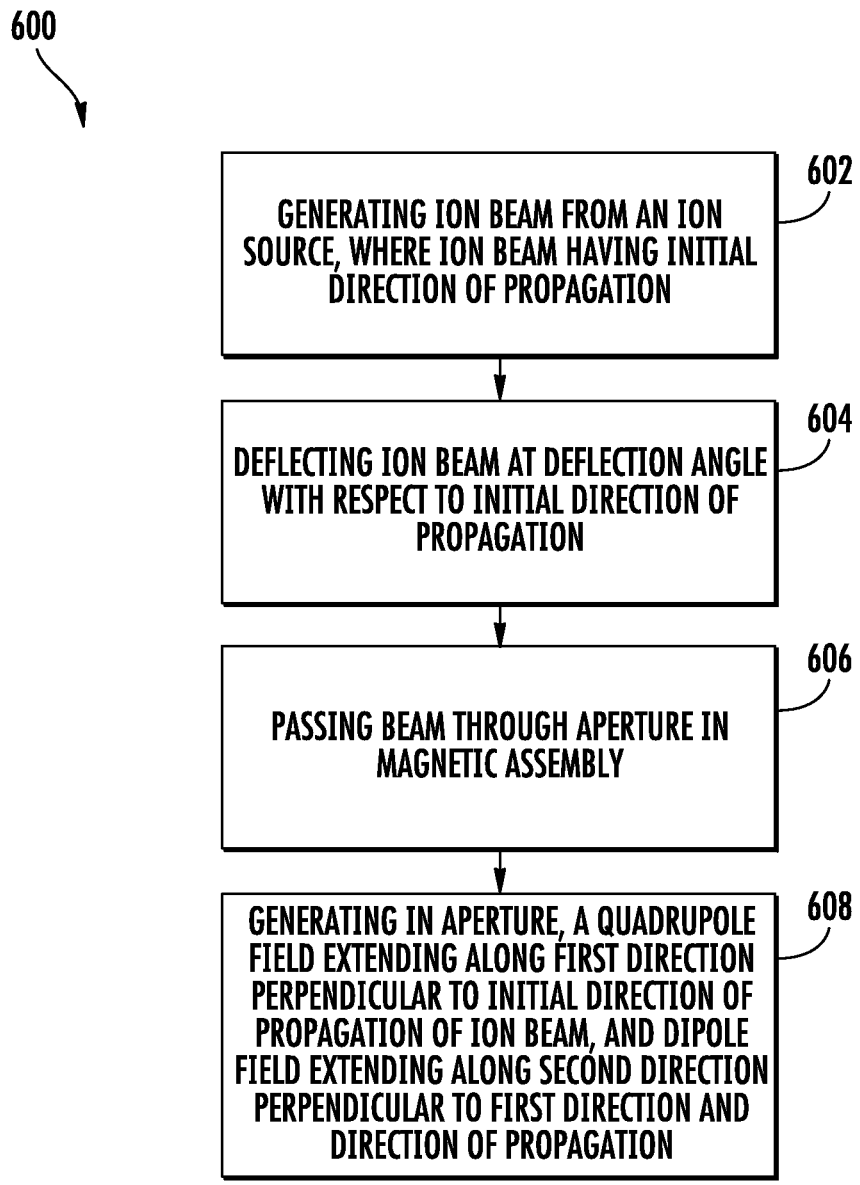
FIG. 6 presents an exemplary process flow.

FIG. 6 presents an exemplary process flow according to various embodiments. At block 602, the operation is performed of generating an ion beam from an ion source, where the ion beam has an initial direction of propagation. In some embodiments, the ion beam may be generated as a ribbon beam extracted from the ion source having an initial direction of propagation parallel to a reference plane of a beamline, where the reference plane may define a center plane extending through more than one beamline component.

At block 604, the ion beam is deflected at an initial angle of inclination with respect to the initial direction of propagation. The deflection of the ion beam may be performed by adjusting the distance between extraction electrode and exit aperture in an ion source, for example.

At block 606, the beam is passed through an aperture in a magnetic assembly. The magnetic assembly may constitute an upper coil and lower coil disposed on a magnetic yoke, for example. At block 608, the operation is performed of generating in the aperture, a quadrupole field extending along a first direction perpendicular to the initial direction of propagation of the ion beam, and a dipole field extending along a second direction perpendicular to the first direction and the initial direction of propagation.

In summary, various advantages afforded by the present embodiments include the ability to independently vary ion beam position as well as angle of inclination of an ion beam before entering an analyzer magnet. A further advantage is the ability to provide an ion beam having a narrow divergence and has an average angle of inclination of zero degrees with respect to a target plane, such as a reference plane of the beamline. In this manner, the ion beam may be more easily conducted through remaining components of a beamline requiring fewer adjustments, for example.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize the usefulness is not limited thereto and the present disclosure may be beneficially implemented in any number of environments for any number of purposes. Thus, the claims set forth below should be construed in view of the full breadth and spirit of the present disclosure as described herein.

What is claimed is:

1. A method, comprising:
generating an ion beam from an ion source, the ion beam having an initial direction of propagation;
deflecting the ion beam at an initial average angle of inclination with respect to the initial direction of propagation;
passing the ion beam through a magnetic assembly, the magnetic assembly including an aperture; and
generating in the aperture, a quadrupole field extending along a first direction perpendicular to the initial direction of propagation of the ion beam, and a dipole field extending along a second direction perpendicular to the first direction and the initial direction of propagation.

2. The method of claim 1, wherein the generating the quadrupole field comprises:
providing a first current through a first coil disposed on a first side of the aperture, the first coil having a first coil axis extending along the second direction; and
providing a second current through a second coil disposed on a second side of the aperture, the second coil having a second coil axis extending along the second direction.

3. The method of claim 2, wherein the generating the dipole field comprises providing the first current to the first coil at a first magnitude and providing the second current at a second magnitude simultaneously to the providing the first current, the second magnitude being different from the first magnitude.

4. The method of claim 2, wherein the magnetic assembly comprises a magnetic yoke, wherein the first coil and the second coil are disposed around the magnetic yoke.

5. The method of claim 2, further comprising providing a bucking current through a first bucking coil disposed on a third side of the aperture, the first bucking coil having a first bucking coil axis extending along the first direction, and providing the bucking current through a second bucking coil disposed on a fourth side of the aperture opposite the third side, the second bucking coil having a second bucking coil axis extending along the first direction.

6. The method of claim 2, wherein a dipole field magnitude of the dipole field varies by less than 50% as a function of position along the second direction between a first position adjacent a first end region of the first coil and second coil, and a second position adjacent a second end region of the first coil and second coil.

7. The method of claim 6, wherein a quadrupole field magnitude of the quadrupole field varies monotonically between a positive value and a negative value along the second direction as a function of position between the first position and the second position.

8. The method of claim 1, wherein the initial angle of inclination is between 1 degree and 4 degrees with respect to the initial direction of propagation.

9. The method of claim 1, wherein the deflecting the ion beam comprises providing an initial divergence of 5 degrees or less along the first direction with respect to the initial direction of propagation before the passing the ion beam through the aperture.

10. The method of claim 1, wherein the generating the quadrupole field and the dipole field comprises generating a reduced divergence of less than 2 degrees along the first direction with respect to the initial direction of propagation after the ion beam through the aperture.

11. The method of claim 1, the ion beam having an elongated cross-section having a long axis along the second direction and a short axis along the first direction.

12. An apparatus to manipulate an ion beam, comprising:
a deflector to receive an ion beam having an initial direction of propagation and to deflect the ion beam along an initial average angle of inclination with respect to the initial direction of propagation;
a magnetic assembly disposed downstream to the deflector, the magnetic assembly including an aperture to receive the ion beam and further comprising:
a magnetic yoke; and
a coil assembly, the coil assembly comprising a first coil disposed along a first side of the magnetic yoke, and a second coil disposed along a second side of the magnetic yoke opposite the first side;
a first current supply coupled to the first coil and a second current supply coupled to the second coil; and
an ion beam controller electrically coupled to the deflector and to the first current supply and the second current supply, the ion beam controller directing a first control signal to the first current supply and second control signal to the second current supply, wherein the first coil and second coil simultaneously generate a magnetic dipole field and a magnetic quadrupole field within the aperture.

13. The apparatus of claim 12, wherein first current supply includes a first component to generate a first current in the first coil responsive to the first control signal and the second current supply includes a second component to generate a second current in the second coil responsive to the second control signal, the second current being different from the first current.

14. The apparatus of claim 12, the magnetic quadrupole field extending along a first direction, the first coil having a first coil axis extending along a second direction perpendicular to the first direction, and the second coil having a second coil axis extending along the second direction.

15. The apparatus of claim 12, wherein the magnetic assembly comprises a magnetic yoke, wherein the first coil and the second coil are disposed around the magnetic yoke.

16. The apparatus of claim 14, further comprising a first bucking coil disposed on a third side of the aperture, the first bucking coil having a first bucking coil axis extending along the first direction, and a second bucking coil disposed on a fourth side of the aperture opposite the third side, the second bucking coil having a second bucking coil axis extending along the first direction.

17. The apparatus of claim 14, wherein a magnitude of the magnetic dipole field varies by less than 50% as a function of position along the second direction between a first position adjacent a first end region of the first coil and second coil, and a second position adjacent a second end region of the first coil and second coil.

18. The apparatus of claim 17, wherein a magnitude of the magnetic quadrupole field varies monotonically between a positive value and a negative value along the second direction as a function of position between the first position and the second position.

19. An ion implanter, comprising:
an ion source having an elongated aperture to generate a ribbon beam having an elongated cross-section and further having an initial direction of propagation;
a deflector to receive the ribbon beam and to deflect the ribbon beam along an initial average angle of inclination with respect to the initial direction of propagation;
a magnetic assembly disposed downstream to the deflector, the magnetic assembly including an aperture to receive the ribbon beam and further comprising:
 a magnetic yoke; and
 a coil assembly, the coil assembly comprising a first coil disposed along a first side of the magnetic yoke, and a second coil disposed along a second side of the magnetic yoke opposite the first side;
 a first current supply coupled to the first coil and a second current supply coupled to the second coil; and
an ion beam controller electrically coupled to the deflector and to the first current supply and the second current supply, the ion beam controller directing a first control signal to the first current supply and second control signal to the second current supply, wherein the first coil and second coil simultaneously generate a magnetic dipole field and a magnetic quadrupole field within the aperture.

* * * * *